United States Patent
Hachtmann et al.

(10) Patent No.: US 9,818,906 B2
(45) Date of Patent: Nov. 14, 2017

(54) WEB BASED CHEMICAL BATH DEPOSITION APPARATUS

(71) Applicant: NUVOSUN, INC., Milpitas, CA (US)

(72) Inventors: Bruce Hachtmann, San Martin, CA (US); Preston Clover, Pasadena, CA (US); Dennis Hollars, Madera, CA (US); Arthur C. Wall, Morgan Hill, CA (US); Rocky Taylor, Los Gatos, CA (US); Gang Grant Peng, Fremont, CA (US)

(73) Assignee: Nuvosun, Inc., Milipitas, CA (US)

( * ) Notice: Subject to any disclaimer, the term of this patent is extended or adjusted under 35 U.S.C. 154(b) by 0 days.

(21) Appl. No.: 15/102,569

(22) PCT Filed: Dec. 19, 2014

(86) PCT No.: PCT/US2014/071384
§ 371 (c)(1),
(2) Date: Jun. 8, 2016

(87) PCT Pub. No.: WO2015/095648
PCT Pub. Date: Jun. 25, 2015

(65) Prior Publication Data
US 2016/0315215 A1    Oct. 27, 2016

Related U.S. Application Data (60) Provisional application No. 61/918,719, filed on Dec. 20, 2013.

(51) Int. Cl.
*H01L 21/00* (2006.01)
*H01L 31/18* (2006.01)
(Continued)

(52) U.S. Cl.
CPC .......... *H01L 31/1876* (2013.01); *B05C 5/007* (2013.01); *B05C 11/026* (2013.01);
(Continued)

(58) Field of Classification Search
CPC .......... H01L 21/02568; H01L 21/02485; H01L 21/02282; B05C 5/004; B05C 9/06; B05C 5/007; B05C 5/008
See application file for complete search history.

(56) References Cited

U.S. PATENT DOCUMENTS

| 3,289,632 A | 12/1966 | Barstow |
| 6,350,318 B1 * | 2/2002 | Ruschak ................ B05C 5/008 118/411 |

(Continued)

FOREIGN PATENT DOCUMENTS

| EP | 1767282 | 3/2007 |
| EP | 2562108 | 2/2013 |

(Continued)

OTHER PUBLICATIONS

International Search Report and Written Opinion in PCT/US2014/071442 dated Apr. 28, 2015.
(Continued)

*Primary Examiner* — Zandra Smith
*Assistant Examiner* — Evan Clinton
(74) *Attorney, Agent, or Firm* — McDonnell Boehnen Hulbert & Berghoff LLP (57) ABSTRACT

Methods and systems for forming a layer from a fluid mixture on a web are provided. The system includes a fluid delivery apparatus for delivering the fluid mixture onto the web. The fluid delivery apparatus includes a cascade device and a chemical dispenser device. The system also includes a fluid stirring apparatus comprising at least one fan positioned over the web and configured to generate a flow
(Continued)

pattern that stirs the fluid mixture on the web while the layer is being formed, without the at least one fan contacting the fluid mixture. The system further includes a fluid removal apparatus having a rinsing device and a suction device. The rinsing device is configured to dispense a rinsing fluid onto the web. The suction device is configured to remove by suction the rinsing fluid and a remaining portion of the fluid mixture remaining on the web after formation of the layer.

20 Claims, 11 Drawing Sheets (51) Int. Cl.
H01L 31/0392 (2006.01)
B05C 5/00 (2006.01)
B05C 11/02 (2006.01)
B05C 11/10 (2006.01)
C23C 18/12 (2006.01)

(52) U.S. Cl.
CPC .... *B05C 11/1039* (2013.01); *H01L 31/03925* (2013.01); *H01L 31/03926* (2013.01); *H01L 31/1836* (2013.01); *H01L 31/1884* (2013.01); *C23C 18/1204* (2013.01); *C23C 18/125* (2013.01); *Y02E 10/50* (2013.01)

(56) References Cited

U.S. PATENT DOCUMENTS

| | | | |
|---|---|---|---|
| 2003/0006218 A1 | 1/2003 | Yasuno et al. | |
| 2009/0246908 A1 | 10/2009 | Basol et al. | |
| 2010/0086699 A1* | 4/2010 | Britt | H01L 31/03928 427/421.1 |
| 2010/0101700 A1* | 4/2010 | Liang | B32B 27/16 156/73.1 |
| 2010/0291727 A1 | 11/2010 | Ashjaee | |
| 2010/0300352 A1* | 12/2010 | Roussillon | C25D 17/00 118/415 |

FOREIGN PATENT DOCUMENTS

| | | |
|---|---|---|
| WO | 03021648 | 3/2003 |
| WO | 2009075944 | 6/2009 |
| WO | 2009111052 | 9/2009 |
| WO | 2009111054 | 9/2009 |
| WO | 2012170368 | 12/2012 |

OTHER PUBLICATIONS

International Search Report and Written Opinion in PCT/US2014/071384 dated Apr. 29, 2015.
International Preliminary Report on Patentability in PCT/US2014/071384 dated Apr. 12, 2015.

* cited by examiner

WEB BASED CHEMICAL BATH DEPOSITION APPARATUS

CROSS-REFERENCE TO RELATED APPLICATIONS

This application is a U.S. national phase of International Application No. PCT/US2014/071384, filed Dec. 19, 2014, which claims priority to U.S. Provisional Application No. 61/918,719, filed Dec. 20, 2013, the disclosure of each of which is hereby incorporated by reference in its entirety.

BACKGROUND

Field of the Invention

The invention relates to web-based chemical bath deposition.

Description of the Related Art

In examples, thin film solar cells on flexible substrates include amorphous silicon disposed on a thin metal foil (e.g., stainless steel) and copper indium gallium diselenide (CIGS) on metallic or polyimide foils. Thin film cadmium telluride (CdTe) solar cells may be produced on glass, but may also be produced on a flexible substrate. Manufacturing solar cells may involve deposition and formation of layers on the flexible substrate.

SUMMARY

In one aspect, the present disclosure describes a system for forming a layer from a fluid mixture on a web. The system comprises a fluid delivery apparatus for delivering the fluid mixture onto the web. The fluid delivery apparatus comprises a cascade device and a chemical dispenser device. The cascade device has an upper level, a lower level positioned above the web, a plurality of steps between the upper level and the lower level, and is configured to vibrate. The chemical dispenser device is configured to dispense a stream of a first fluid of the fluid mixture and a stream of a second fluid of the fluid mixture onto the upper level of the cascade device, such that (i) the first and second fluids cascade down the steps to the lower level and onto the web and (ii) the first and second fluids are at least partially mixed by the cascade and by vibration of the cascade device prior to reaching the web. The system also comprises a fluid stirring apparatus comprising at least one fan positioned over the web and configured to generate a flow pattern that stirs the fluid mixture on the web while the layer is being formed, without the at least one fan contacting the fluid mixture. The system further comprises a fluid removal apparatus comprising a rinsing device and a suction device. The rinsing device is configured to dispense a rinsing fluid onto the web, and the suction device is configured to remove by suction the rinsing fluid and a remaining portion of the fluid mixture remaining on the web after formation of the layer.

In another aspect, the present disclosure describes a method for forming a layer from a fluid mixture on a web. The method comprises dispensing a stream of a first fluid of the fluid mixture and a stream of a second fluid of the fluid mixture onto a cascade device. The cascade device has an upper level, a lower level positioned above the web, a plurality of steps between the upper level and the lower level, and is configured to vibrate. The steam of first fluid and the stream of the second fluid are dispensed onto the upper level of the cascade device, such that (i) the first and second fluids cascade down the steps to the lower level and onto the web and (ii) the first and second fluids are at least partially mixed by the cascade and by vibration of the cascade device prior to reaching the web. The method also comprises generating, using at least one fan positioned over the web, a flow pattern that stirs the fluid mixture on the web while the layer is being formed, without the at least one fan contacting the fluid mixture. The method further comprises dispensing a rinsing fluid onto the web, and removing by suction the rinsing fluid and a remaining portion of the fluid mixture remaining on the web after formation of the layer.

The foregoing summary is illustrative only and is not intended to be in any way limiting. In addition to the illustrative aspects, embodiments, and features described above, further aspects, embodiments, and features will become apparent by reference to the figures and the following detailed description.

DETAILED DESCRIPTION

The following detailed description describes various features and functions of the disclosed systems and methods with reference to the accompanying figures. In the figures, similar symbols identify similar components, unless context dictates otherwise. The illustrative system and method embodiments described herein are not meant to be limiting. It may be readily understood that certain aspects of the disclosed systems and methods can be arranged and combined in a wide variety of different configurations, all of which are contemplated herein.

The terms "photovoltaic cell" (also "solar cell" herein), as used herein, generally refers to a device comprising a photoactive material (or absorber) that is configured to generate electrons (or electricity) upon exposure of the device to electromagnetic radiation (or energy), or a given wavelength or distribution of wavelengths of electromagnetic radiation. Solar cells may be electrically connected in series with other similar solar cells to raise the voltage levels and minimize resistive losses that would otherwise occur due to high currents. In some examples, a large number of solar cells can be serially connected and integrated into solar modules that are several meters long.

Forming photovoltaic cells may involve making use of thin-film, light-absorbing semiconductor materials. An example photovoltaic cell may include a stainless steel web substrate. The stainless steel web substrate may be a flexible substrate. In an example, processing the stainless steel web substrate to form the photovoltaic device may include forming a molybdenum (Mo) layer on a backside of the stainless steel web substrate. Thereafter processing may occur on a front side of the stainless steel substrate. For instance, a chromium (Cr) layer may be formed adjacent to the substrate and a Mo layer may be formed over the Cr layer. An absorber layer that in the cell converts light to electricity may be the next layer. This is typically a p-type layer. Preferred absorbers are copper chalcogenides, such as copper indium selenides, sulfides or selenide sulfide (together referred to as CIS layers). Copper indium gallium selenides (CIGS) are preferred. The absorber layer may be doped with sodium (Na). An n-type layer may be formed as a buffer layer over the absorber layer. Cadmium sulfide (CdS) buffer layer is preferred. The method of this invention is suitable for use in forming this buffer layer. Further, additional transparent conductor layers and other layers may be formed over the buffer layer by standard methods. For example, in one preferred embodiment a resistive zinc oxide (ZnO) layer may be formed over the buffer layer and a transparent conductive oxide (TCO, for example indium tin oxide or aluminum zonc oxide) layer may be formed over the zinc oxide layer.

In examples, forming the component layers of the photovoltaic cell may involve a plurality of roll-to-roll deposition systems or stages. As an example, in a first stage, the backside of a stainless steel web substrate is coated with a back side Mo layer, and the front side of the stainless steel substrate is coated with a back electrode Cr/Mo, an alkali metal sodium fluoride (NaF) layer, and a precursor CIGs layer. Within a second stage, the CIGs precursor may be fully reacted to form photoactive CIGS. In a third stage, the CdS buffer layer may be deposited. In a fourth stage, a transparent oxide layers (ZnO/TCO) may be deposited.

These stages, systems, or processing steps are examples for illustration only. More or less steps/stages may be used and different material can be used to form a given photovoltaic cell. Forming a buffer layer on top of a web-based photovoltaic absorber layer (e.g., forming a CdS layer) may involve depositing a fluid mixture on the web and the absorber layer coupled thereto. Depositing the fluid mixture to form a uniform buffer layer over the web may involve multiple challenges. For example, it may be desirable to provide precise geometric control and thermal control of the web as the web moves across the multiple processing stages as the buffer layer is being formed. As described above, the web, e.g., stainless steel flexible substrate, may be received in the form of a roll. The roll may be unwound to provide a flat web on which one or more uniform layers can be formed. A first challenge may involve providing the web with a sufficiently planar surface, for example, a surface that is flat to within less than a millimeter over a width of about a meter and a length of tens of meters.

Another challenge may involve mixing multiple fluids to be deposited on the web. As an example, assuming two or more fluids are to be mixed, the fluids may be mixed remotely and then delivered to the processing system for deposition on the web. The mixed fluids, which are reactive, may be delivered via multiple valve systems and conduits to the processing system. The mixed reacting or active fluids may interact with components of the delivery system may thus be contaminated with particles that eventually are also deposited on the web.

Still another challenge may involve agitating the fluids to provide for a better mixing without contaminating the fluids within the constraints of forming a uniform thin layer (e.g., a fluid with a depth of 5-10 mm) over the web. Yet still another challenge may involve removal of excess fluids and debris (e.g., CdS particles that have nucleated within the fluid mixture) from the web upon formation of the layer.

Disclosed herein are methods and systems that can address the aforementioned challenges. The methods and systems involve shaping a moving web so that it is sufficiently flat to form a uniform layer while still being able hold a fluid mixture that forms the layer, providing for proper mixing and agitation of the fluids without contamination, and providing for removal of residual material and debris. The methods and systems are described in the context of photovoltaic cells as an example for illustration only. The methods and systems described herein generally relate to depositing any type of layer over any type of web.

I. Shaping a Moving Web

Figure 1:
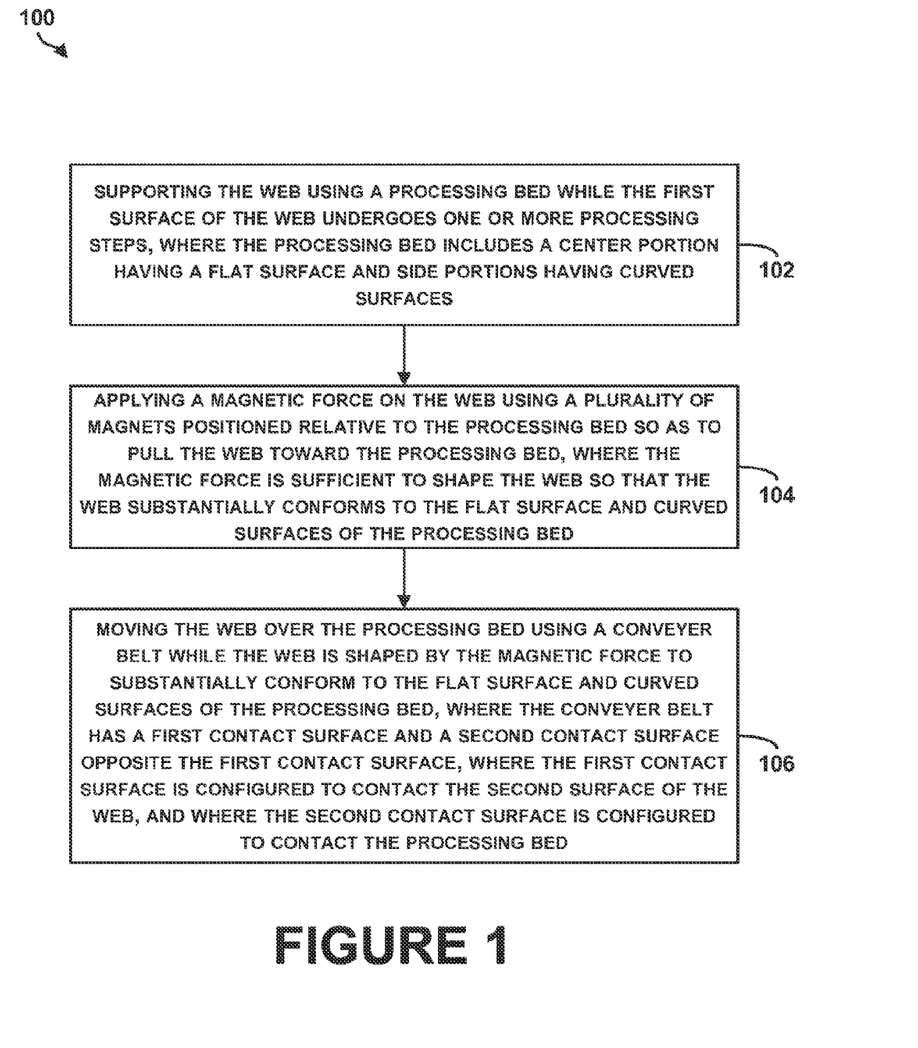
FIG. 1 is a flow chart illustrating a method for shaping a moving web, in accordance with an example embodiment.

FIG. 1 is a flow chart illustrating a method 100 for shaping a moving web, in accordance with an example embodiment. The method 100 may include one or more operations, functions, or actions as illustrated by one or more of blocks 102-106. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

In this example, the web has a first surface (where the formation of a CdS layer or a different material deposited by chemical bath deposition or other processing occurs, for example) and a second surface opposite the first surface. The web also includes a magnetic material, such as a substrate composed of a magnetic form of stainless steel.

At block 102, the method 100 includes supporting the web using a processing bed while the first surface of the web undergoes one or more processing steps, where the processing bed includes a center portion having a flat surface and side portions having curved surfaces.

Figure 2A:
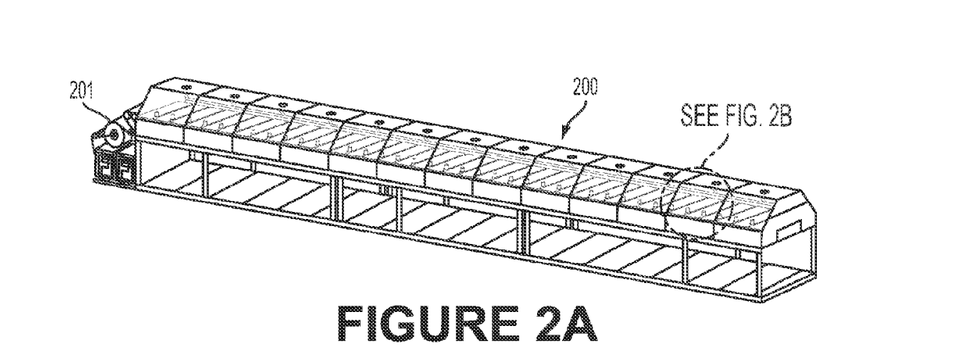
FIG. 2A illustrates a system for processing a web, in accordance with an example embodiment.
Figure 2B:
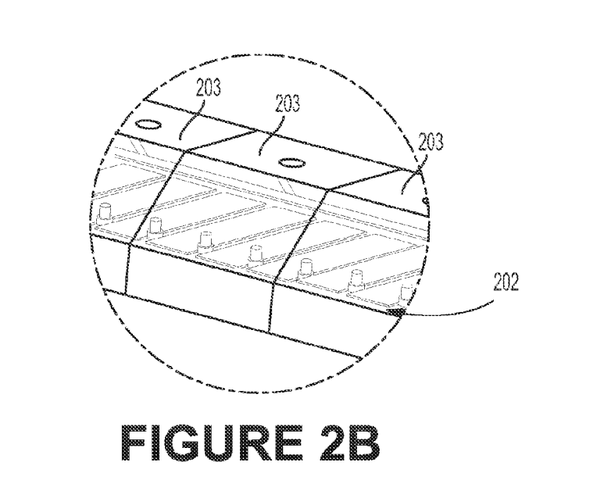
FIG. 2B illustrates a portion of the system shown in FIG. 2A, in accordance with an example embodiment.

FIG. 2A illustrates a system 200 for processing a web, in accordance with an example embodiment. FIG. 2A depicts system (or apparatus) 200 that may include a plurality of processing stages for the web. The system 200 may be configured for depositing a layer from a chemical fluid mixture bath on a web. Thus, the system 200 may be referred to as chemical bath deposition system or apparatus. FIG. 2B illustrates a portion of the system 200, in accordance with an example embodiment. As shown, the portion of system 200 includes a processing bed 202 underneath one or more processing systems 203. The web from roll 201 may be conveyed through system 200 such that the web is supported by the processing bed 202 while it undergoes processing by the one or more processing systems 203.

Figure 2C:
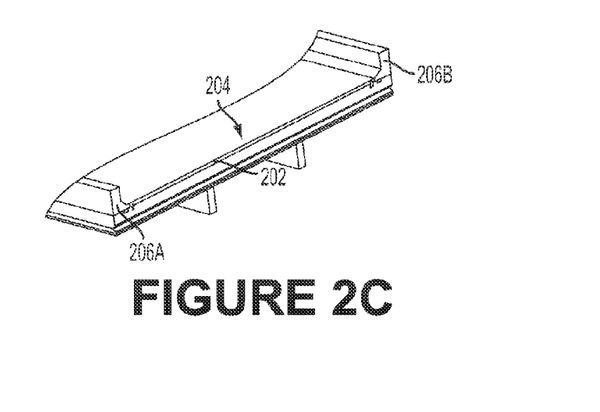
FIG. 2C illustrates a processing bed in the portion illustrated in FIG. 2B, in accordance with an example embodiment.

FIG. 2C illustrates in more detail the processing bed 202 in the portion illustrated in FIG. 2B, in accordance with an example embodiment. The processing bed 202 may include a center portion 204 having a flat surface and side portions 206A and 206B having curved surfaces as shown in FIG. 2C. The curved surfaces of the side portions 206A and 206B may be configured to extend upwardly (e.g., curl or angle upwardly) from opposite sides of the flat surface of the center portion 204 of the processing bed 202 as shown in FIG. 2C. In this manner, the processing bed 202 may be configured to have a trough-like shape.

Referring back to FIG. 1, at block 104 the method 100 includes applying a magnetic force on the web using a plurality of magnets positioned relative to the processing bed so as to pull the web toward the processing bed, where the magnetic force is sufficient to shape the web so that the web substantially conforms to the flat surface and curved surfaces of the processing bed. The processing bed 202 shown in FIG. 2C may include a plurality of magnets. The plurality of magnets may be embedded in the processing bed 202 proximate to both the center portion 204 and the side portions 206A and 206B.

Figure 3A:
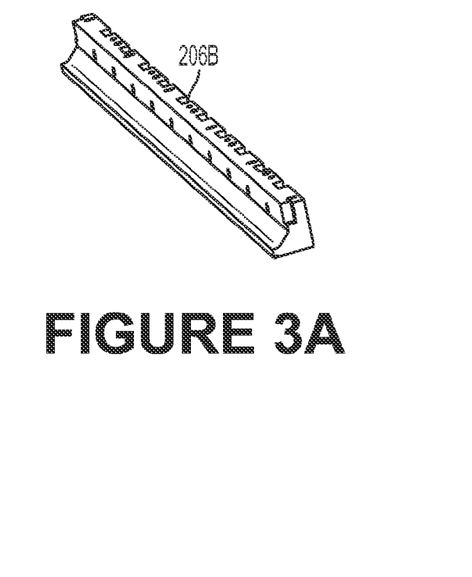
FIG. 3A illustrates a side portion of a processing bed, in accordance with an example embodiment.
Figure 3B:
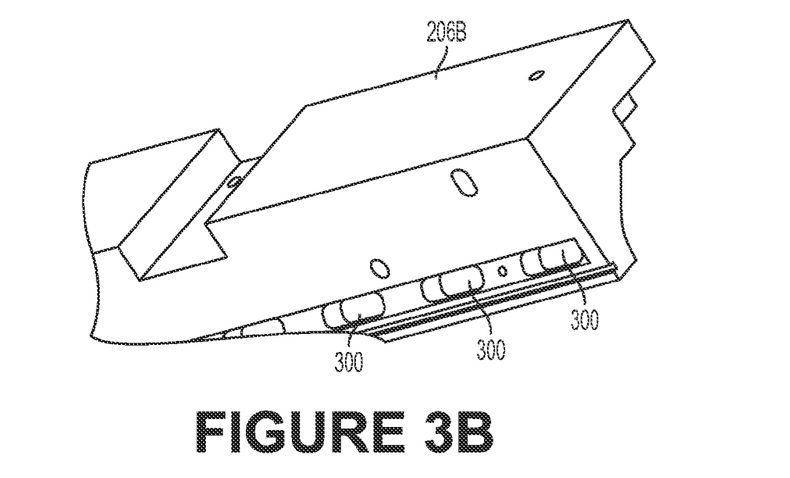
FIG. 3B illustrates an array of magnets embedded in the side portion, in accordance with an example embodiment.

FIG. 3A illustrates the side portion 206B of the processing bed 202, in accordance with an example embodiment. FIG. 3B illustrates an array of magnets 300 embedded in the side portion 206B, in accordance with an example embodiment. A similar array of magnets (not shown) may be also embedded in the center portion 204 and the side portion 206A of the processing bed 202.

Figure 4:
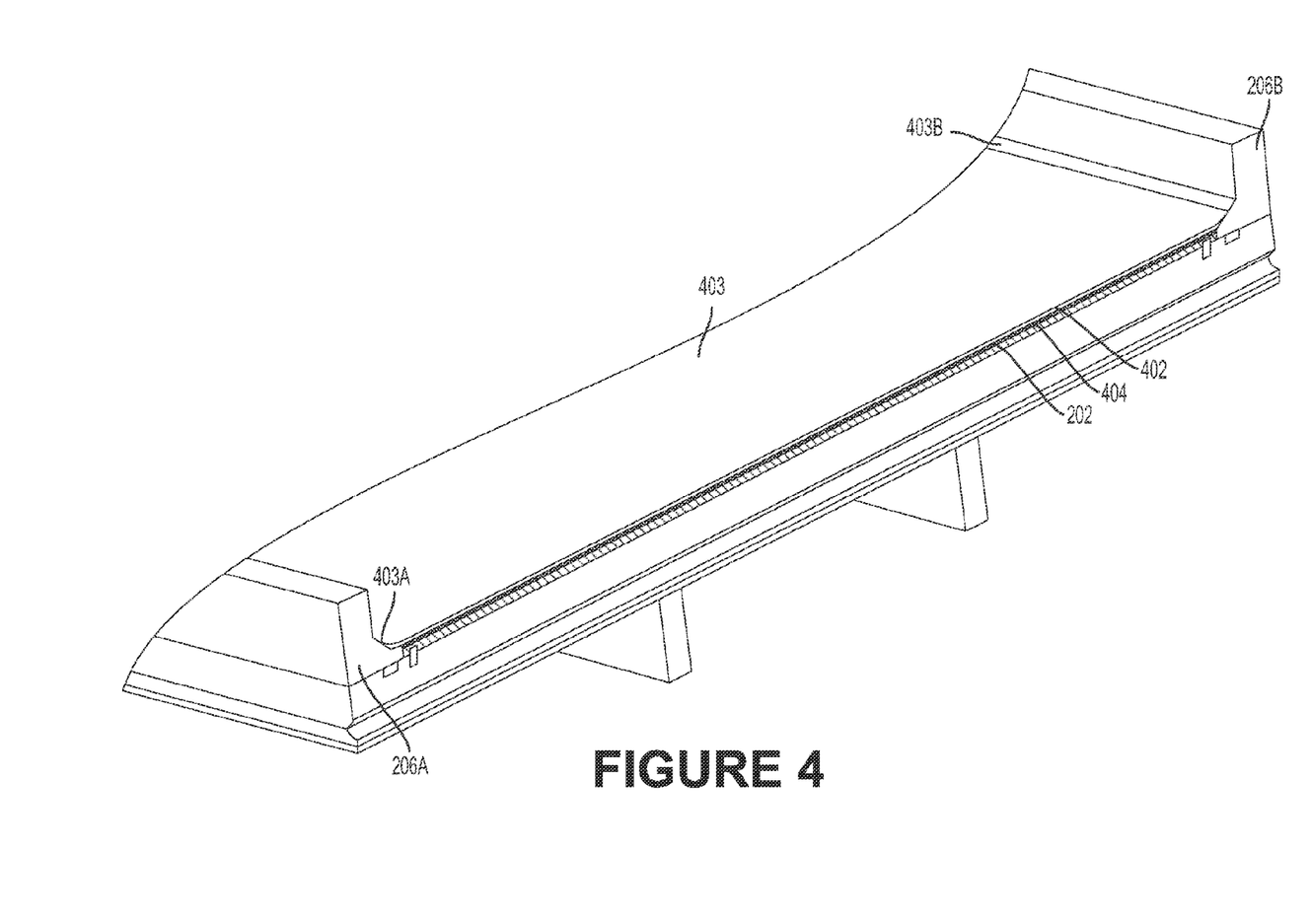
FIG. 4 illustrates a web conforming to a flat surface and curved surfaces of the processing bed, in accordance with an example embodiment.

FIG. 4 illustrates a web 402 conforming to the flat surface and curved surfaces of the processing bed 202, in accordance with an example embodiment. As indicated above, the web 402 may include a magnetic material. In examples, the web 402 may be a coated metal or coated metallized polymer. In one example, the web 402 may include a magnetic stainless steel (e.g., Ferritic and Martensitic stainless steel, such as grade 413 stainless steel). The array of magnets (e.g., the array of magnets 300) embedded in the processing bed 202 may be configured to interact with the magnetic material of the web 402. For instance, the array of magnets may be positioned relative to the processing bed 202 so as to exert a magnetic force on the web 402 that pulls the web 402 toward the processing bed 202. The magnets are configured to exert a sufficient force that shapes the web 402 so that the web 402 substantially conforms to the flat surface and curved surfaces of the processing bed 202. In an example, the array of magnets such as the array of magnets 300 may include movable permanent magnets. In this example, locations or positions of the array of magnets may be adjusted so as to adjust a magnetic force or magnetic field produced by the array of magnets. In another example, the array of magnets may be an array of electromagnets that can be controlled via an electric current. The electromagnets can thus be turned on or off and strength of the magnetic field/force produced can be adjusted.

In this manner, the web 402 is shaped to include a center portion 403 having a flat shape that conforms to the flat surface of center portion 204 of processing bed 202 and side portions 403A and 403B that curve upwards to substantially conform to curved surfaces of side portions 206a and 206b, respectively, of processing bed 202. Thus, the forces exerted by the magnets makes web 402 trough-shaped based on the trough shape of the processing bed 402. As described below with respect to the method 600 of FIG. 6, the trough shape of the web 402 facilitates fluid containment (e.g., keeping the fluid on one side of the web 402).

In some examples, in addition or alternative to, the processing bed 202 having an array of magnets (e.g., the array of magnets 300), the processing bed may be made of magnetic material (entirely or partially) that interacts with the magnetic material of the web 402 to pull the web 402 downwards.

Referring back to FIG. 1, at block 106 the method 100 includes moving the web over the processing bed using a conveyor belt while the web is shaped by the magnetic force to substantially conform to the flat surface and curved surfaces of the processing bed. The conveyor belt has a first contact surface and a second contact surface opposite the first contact surface. The first contact surface is configured to contact the second surface of the web, and the second contact surface is configured to contact the processing bed. FIG. 4 depicts a conveyor belt 404 disposed between the web 402 and the processing bed 202, and configured to move the web 402 over the processing bed 202.

Figure 5:
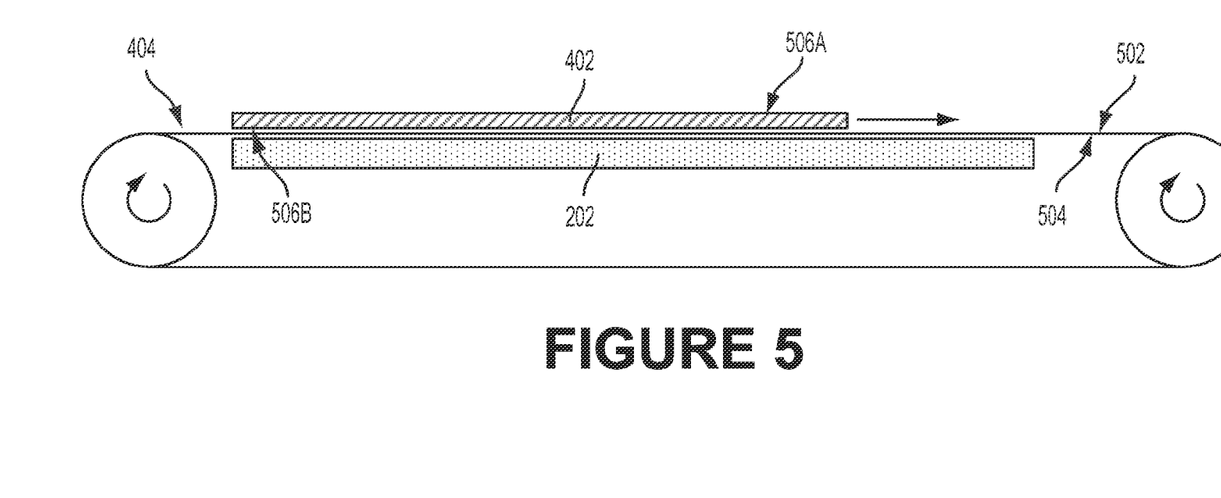
FIG. 5 illustrates a conveyor belt disposed between the processing bed and the web, in accordance with an example embodiment.

FIG. 5 illustrates the conveyor belt 404 disposed between the processing bed 202 and the web 402, in accordance with an example embodiment. The conveyor belt 404 has a first contact surface 502 and a second contact surface 504 opposite the first contact surface 502. The web 402 has a first surface 506A and a second surface 506B opposite the first surface. The first surface of the web 402 may be facing upwards and may undergo several processing steps as described below with respect to the method 600. The second surface of the web 402 may be configured to contact the first contact surface 502 of the conveyor belt 404. The second contact surface 504 is configured to contact the processing bed 202 as shown in FIG. 5.

In examples, the first contact surface 502 of the conveyor belt 404 may be configured to have a high coefficient of friction so as to apply traction to the second surface 506B of the web 402 such that the web 402 moves along with the conveyor belt 404. The second contact surface 504 of the conveyor belt 404 may have a low coefficient of friction (e.g., lower than the coefficient of friction of the first contact surface 502) so as to slide over and move relative to the flat surface of the processing bed 202. Thus, as the conveyor belt 404 moves/rotates, the web 402 moves with the conveyor belt 404 while the processing bed 202 remains stationary. Although the conveyor belt 404 is shown in FIG. 5 to move in a certain direction (e.g., rotation in clockwise direction), in other cases the conveyor belt 404 and the web 402 may move in an opposite direction.

The array of magnets embedded in the processing bed 202 is configured to interact with the magnetic material of the web 402 through the conveyor belt 404. Thus, the forces exerted by the magnets cause the web 402 to maintain the trough shape described above while the web is being moved by conveyor belt 404. The difference in respective coefficients of friction of the first contact surface 502 and the second contact surface 504 decouples the friction between the web 402 and processing bed 202 having the array of magnets embedded therein because there is no direct contact between the web 402 and the processing bed 202. Thus, motion, speed, and tension of the web 402 are decoupled from the processing bed 202 and such decoupling may prevent breakage of the web 402 as the web 402 is being carried by the conveyor belt 404 through the plurality of stages or processing steps of the system 200. The conveyor belt 404 is configured to move the web 402 through the plurality of stages or processing steps of the system 200 so as to form a layer from a fluid mixture on the first surface 506A of the web 402.

II. Fluid Handling

Figure 6:
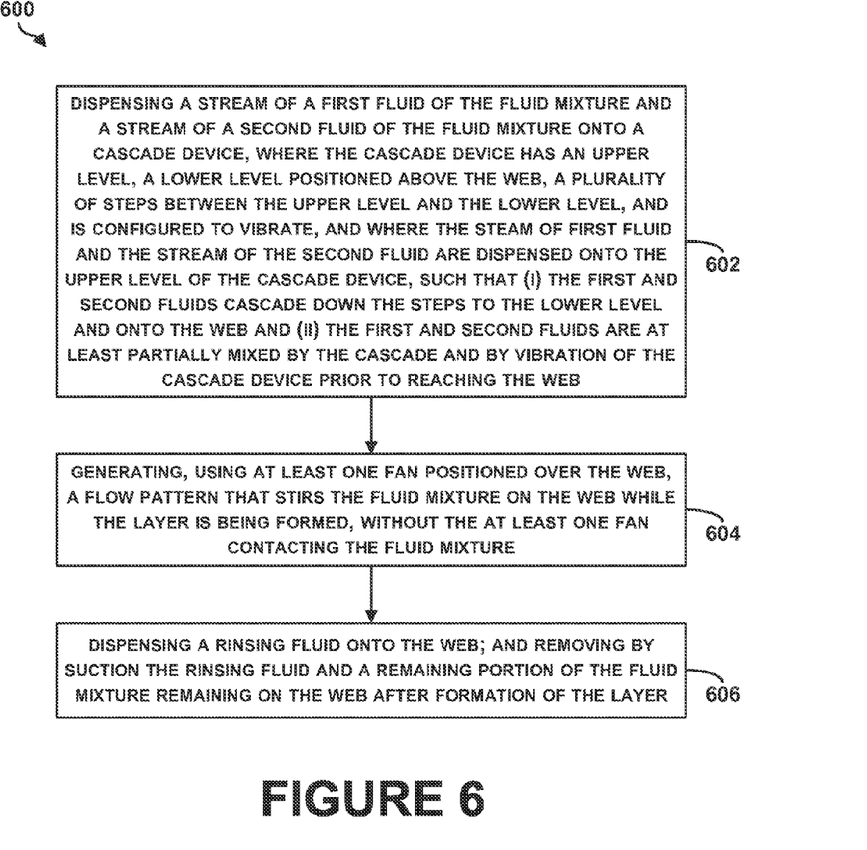
FIG. 6 is a flow chart illustrating a method for forming a layer from a fluid mixture on a web, in accordance with an example embodiment.

FIG. 6 is a flow chart illustrating a method 600 for forming a layer from a fluid mixture on a web, in accordance with an example embodiment. The method 600 may include one or more operations, functions, or actions as illustrated by one or more of blocks 602-606. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

At block 602, the method 600 includes dispensing a stream of a first fluid of the fluid mixture and a stream of a second fluid of the fluid mixture onto a cascade device. The cascade device has an upper level, a lower level positioned above the web, a plurality of steps between the upper level and the lower level, and is configured to vibrate. The stream of first fluid and the stream of the second fluid are dispensed onto the upper level of the cascade device, such that (i) the first and second fluids cascade down the steps to the lower level and onto the web and (ii) the first and second fluids are at least partially mixed by the cascade and by vibration of the cascade device prior to reaching the web.

In examples, any number of fluids can be mixed to form a layer on the web. The method 600 is described herein using a mixture of two fluids as an example for illustration only. As an example for illustration, the first fluid may be a chemical solution including cadmium sulfate ($CdSO_4$) and ammonia hydroxide ($NH_4OH$) while the second fluid may be a chemical solution including thiourea ($SC(NH_2)_2$). In this example, the resulting layer depositing on the web may thus include cadmium sulfide (CdS). As an alternative, a layer of zinc sulfide or indium sulfide could be formed by substituting either zinc sulfate ($ZnSO_4$) or indium sulfate ($In_2(SO_4)_3$) in place of the cadmium sulfate ($CdSO_4$). In one example, the first fluid and the second fluid may be mixed at mixing stations remote from the web surface and then transported as a ready to react mixture to a distribution nozzle or any other distribution means to be deposited on the surface of the web. However, overtime the mixture may interact with valves, pipes, components, etc. of the transportation system and may thus generate debris and contaminants that are mingled with the fluid mixture to be deposited on the web.

In another example, alternative to mixing the fluids at a remote station, the stream of the first fluid and the stream of the second fluid are each brought separately to a distribution head (e.g., including one or more nozzles) above the web, and are each individually presented onto a vibrating cascade that mixes the solutions just prior to their falling from the cascade onto the surface of the web. In this manner, no debris or contaminants are generated from interaction of an already reacting fluid mixture with components and transmission lines of the fluid transportation system.

Figure 7:
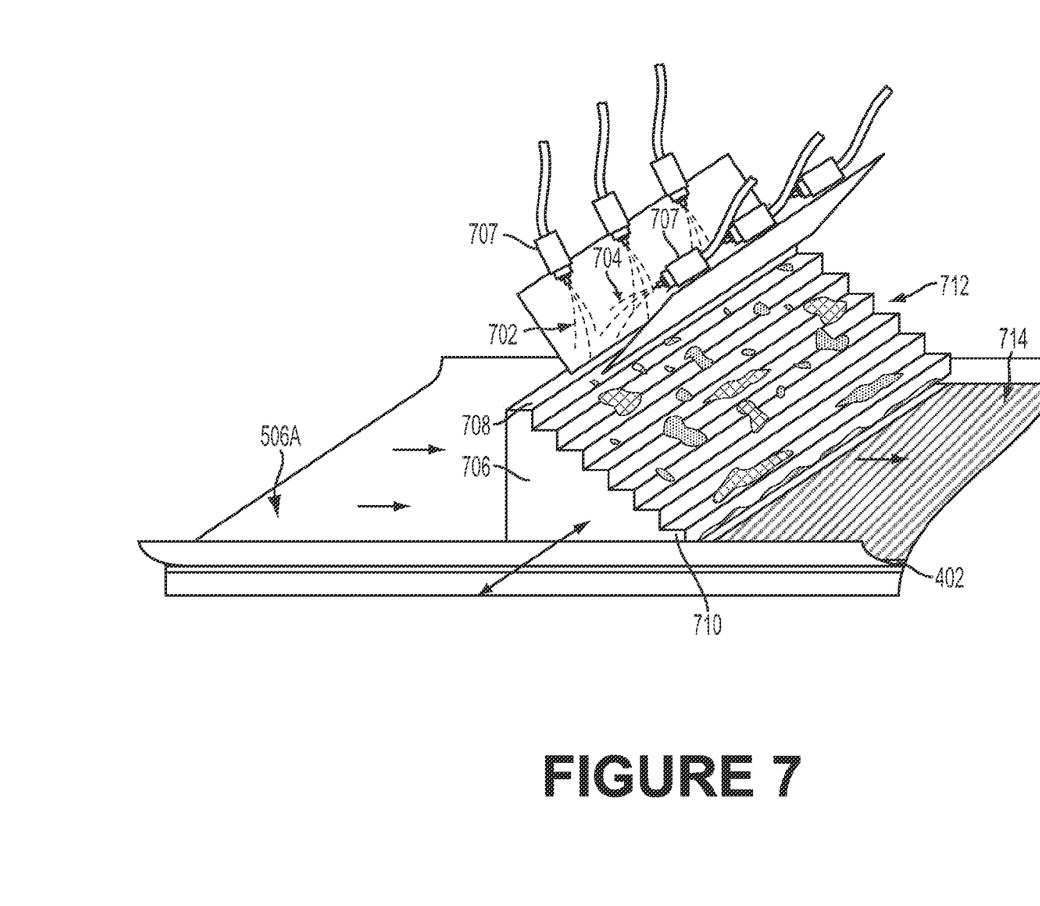
FIG. 7 illustrates a fluid delivery apparatus for dispensing a stream of a first fluid of the fluid mixture and a stream of a second fluid of the fluid mixture onto a cascade device, in accordance with an example embodiment.

FIG. 7 illustrates a fluid delivery apparatus dispensing a stream of a first fluid 702 of the fluid mixture and a stream of a second fluid 704 onto a cascade device 706, in accordance with an example embodiment. The fluid delivery apparatus may include a chemical dispenser device, such as nozzles 707 shown in FIG. 7, configured to dispense the stream of the first fluid 702 and the stream of the second fluid 704 onto the cascade device 706. The cascade device 706 may have an upper level 708 and a lower level 710 positioned above the web 402 (e.g., at a predetermined distance from the first surface 506A of the web 402). The cascade device 706 may also include a plurality of steps 712 between the upper level 708 and the lower level 710.

Further, the cascade device 706 may be configured to vibrate. For example, the cascade device 706 may be configured to oscillate in a lateral, longitudinal, vertical direction or a combination thereof. The cascade device 706 may be configured to vibrate at a predetermined frequency or according to a predetermined frequency and direction profile over time. Any mechanism configured to cause vibration of the cascade device 706 can be used. The mechanism, for example, could utilize an electric system (e.g., electric motors), a hydraulic system, an electro-mechanical system, an electro-hydraulic system, etc. to cause the cascade device 706 to vibrate.

In this manner, as the stream of first fluid 702 and the stream of the second fluid 704 are dispensed onto the upper level 708 of the cascade device 706, the first fluid 702 and second fluid 704 cascade down the steps 712 to the lower level 710 and onto the web 402. Cascading the first fluid 702 and the second fluid 704 down the steps 712 while the cascade device 706 vibrates facilitates at least partial mixing of the fluids 702 and 704 prior to reaching the web 402. In one example, the first fluid 702 and the second fluid 704 may be fully mixed before reaching the web 402.

A fluid mixture 714 of the first fluid 702 and the second fluid 704 dispensed onto the web 402 may form a solution having a given thickness or depth, e.g., in the range of 1-10 millimeters, covering the first surface 506A of the web 402. Any fluid depth can be utilized based on the type of the web 402, the fluids being deposited, the layer to be created, etc. As described with respect to FIG. 4, the web 402 may be trough-shapes with a center portion 403 having a flat surface and side portions 403A, 403B that curve upwards to substantially conform to the shape of the processing bed 202. The trough shape of the web 402 facilitates containing the fluid mixture 714 on the first surface 506A of the web 402 while the first surface 506A of the web 402 undergoes further processing steps.

Referring back to FIG. 6, at block 604, the method 600 includes generating, using at least one fan positioned over the web, a flow pattern that stirs the fluid mixture on the web while the layer is being formed, without any fan contacting the fluid mixture. To facilitate formation of a uniform layer from the mixture of fluids dispensed onto the surface of the web, a stirring (or agitation) apparatus may be used to provide for mixing of the solution in contact with the surface of the web. Preferably, the stirring apparatus is configured to provide for mixing the solution without contaminating the reaction of the fluid mixture, damaging the surface of the web, or generating any debris.

Figure 8A:
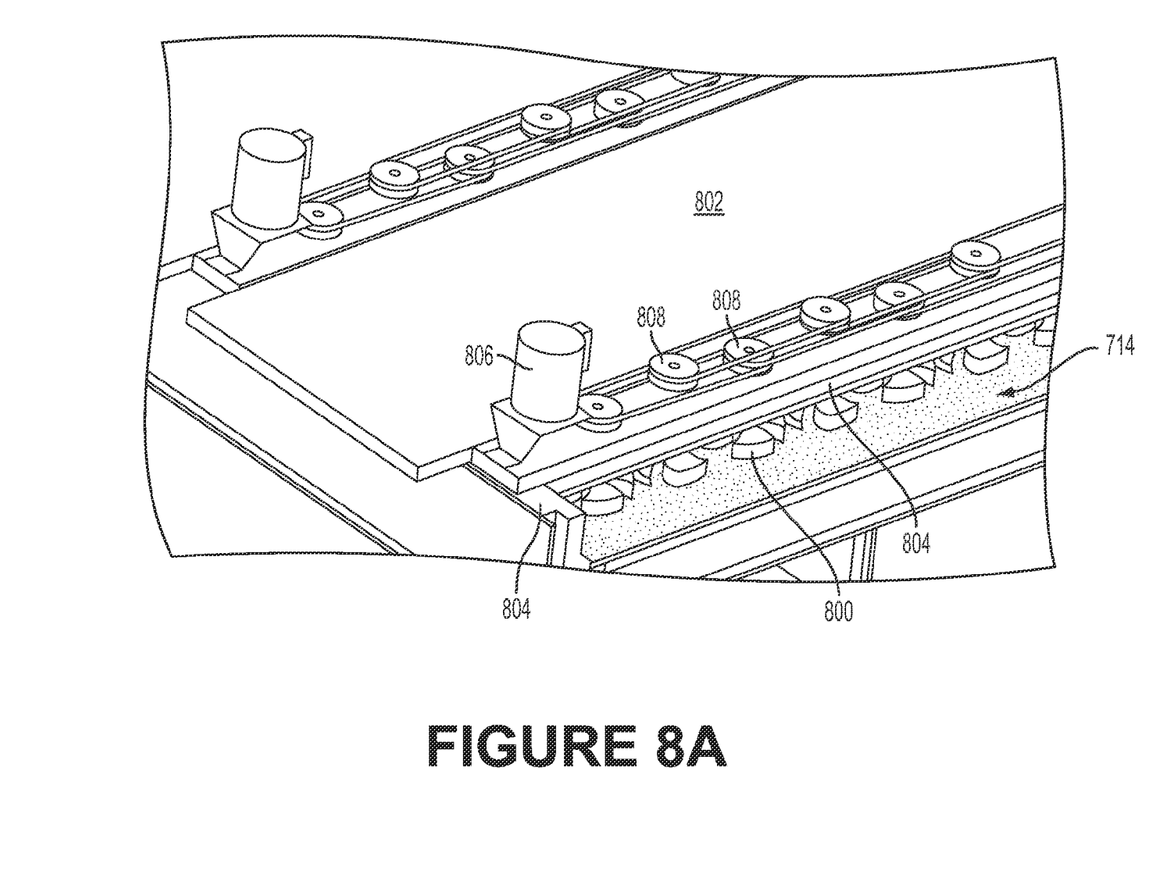
FIG. 8A illustrates a fluid stirring apparatus for generating a flow pattern for stirring the fluid mixture on the web, in accordance with an example embodiment.

FIG. 8A illustrates a fluid stirring apparatus for generating a flow pattern for stirring the fluid mixture 714 on the web 402, in accordance with an example embodiment. In some examples, the system 200 may include one or more heaters (not shown) configured to heat the processing bed 202 supporting the web 402. Heat generated by the one or more heaters may be transferred (e.g., by conduction) to the web 402 and the fluid mixture 714 dispensed thereon, and may facilitate reaction of the first fluid 702 and the second fluid 704 to enable formation of a layer. As a result of the reaction, gas or vapor and heat may be generated. For example, if the first fluid 702 includes cadmium sulfate and the second fluid 704 includes thiourea, the vapor may include ammonia or ammonia-based gas. FIG. 8A depicts glass panels 802 and a sealing surface 804 that form an enclosure configured to confine the vapor and heat released by the chemical reaction of the fluid mixture 714 dispensed onto the first surface 506A of the web 402.

Further, FIG. 8A depicts that the enclosure, at least partially, surrounds an array of fans 800 configured to distribute the vapor and heat released from the fluid mixture 714. In some examples, in addition to the vapor released from the chemical reaction, the system 200 may include means for injecting gases (e.g., an inert gas) in the enclosure to be distributed and circulated uniformly over the fluid mixture 714 by the array of fans 800.

The fluid stirring apparatus may be configured to cause fans of the array of fans 800 to rotate by any actuation means such as electric motor 806, for example. The electric motor 806 as depicted in FIG. 8A is configured to control an array of pulleys 808 that corresponds to the array of fans 800 and configured to drive the array of fans 800 in a given direction and at a given speed. Using the electric motor 806 and the pulleys 808 is an example for illustration only, and any other driving mechanism can be used to drive the array of fans 800. For example, each fan of the array of fans 800 can be driven by a corresponding electric motor.

Figure 8B:
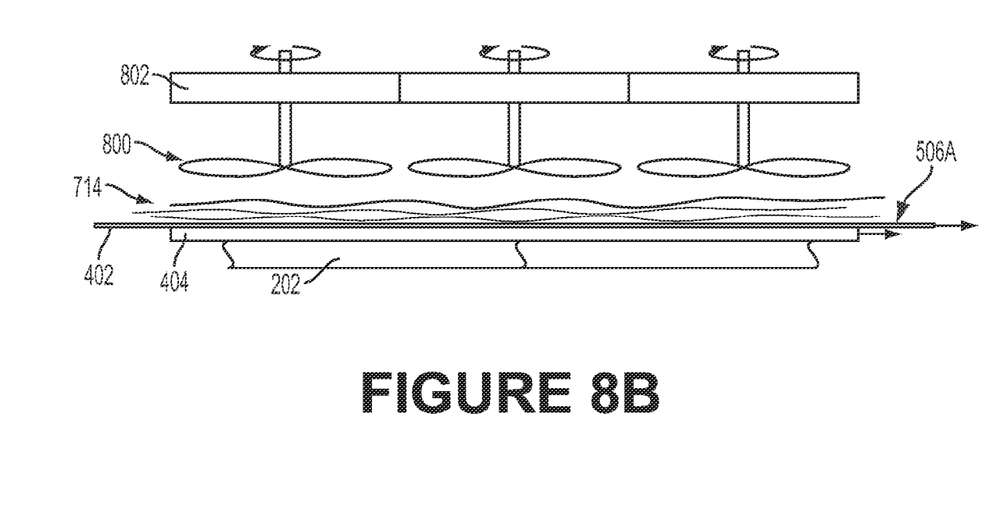
FIG. 8B illustrates a side view of the fluid stirring apparatus depicted in FIG. 8A, in accordance with an example embodiment.

FIG. 8B illustrates a side view of the fluid stirring apparatus depicted in FIG. 8A, in accordance with an example embodiment. As depicted in FIG. 8B, the array of fans 800 does not physically contact or contaminate the fluid mixture 714. Thus, no debris or contaminants are produced as a result of stirring the fluid mixture 714. Also, the first surface 506A of the web 402 is not damaged because of lack of physical contact between the array of fans 800 and the web 402.

In one example, the fluid stirring apparatus may be configured to control the array of fans 800 to rotate in a given direction at a given speed for a given amount of time. In other examples, the fluid stirring apparatus may be configured to control speed and direction of rotation of the array of fans 800 over repeated cycles in an oscillatory manner. For example, a given cycle may include the array of fans 800 rotating in a first direction for a first predetermined amount of time; stopping rotation for a second predetermined of time; and rotating in a second direction opposite to the first direction for a third predetermined amount of time. In some examples, fans of the array of fans 800 may not all be rotating in the same direction and at the same speed. For instance, some fans may rotate in a given direction, while others rotate in the opposite direction, while others may not be rotating. Also, in examples, individual fans may rotate at different speeds. In this manner, the fluid stirring apparatus may be configured to create a laminar flow and/or turbulent flow in the fluid mixture 714 depending on the type of fluids and the chemical reaction.

Thus, the one or more heaters in combination with the array of fans 800 may be configured to control vapor movement and heat distribution in the enclosure. For example, rotation of the array of fans 800 may cause vapor pressure to be applied to the fluid mixture 714 and may generate a flow pattern or waves in the fluid mixture 714 causing the fluid mixture 714 to be stirred or agitated. Controlling the rotation cycles of the array of fans 800 can be used to optimize mixing of the fluids in the fluid mixture 714 and may cause a predetermined temperature profile to be maintained in the fluid mixture 714. The agitation and the temperature profile maintained in the fluid mixture 714 may facilitate reaction within the fluid mixture 714 and formation of a uniform layer over the web 402.

As described above, one or more heaters may be used to heat the processing bed 202. In some examples, the processing bed 202 may be divided into separate sections, each section being heated to a respective temperature. As an example for illustration, a section of the processing bed 202, where the cascade device 706 is disposed and the fluid mixture 714 is dispensed onto the web 402, may be heated to an elevated temperature. As the web 402 moves to other sections of the processing bed 202, temperature may be raised gradually to create a temperature gradient that facilitates chemical reaction within the fluid mixture 714. For instance, a following section may be heated to a temperature of 65° C.-90° C. To cause different sections of the processing bed 202 to be heated to different temperature without causing heat to be transferred from section to another, thermal dividers can be used to thermally isolate individual sections of the processing bed 202 from each other.

Figure 9:
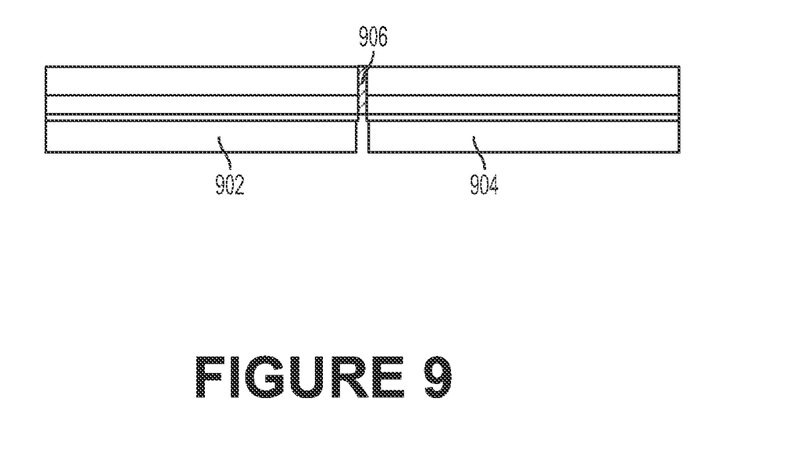
FIG. 9 illustrates an apparatus for providing thermal differencing between sections of the processing bed, in accordance with an example embodiment.

FIG. 9 illustrates an apparatus for providing thermal differencing between sections of the processing bed 202, in accordance with an example embodiment. FIG. 9 depicts a first section 902 of the processing bed 202, and a second section 904 of the processing bed separated by a thermal divider 906. The thermal divider 906 thermally isolates the first section 902 from the section 904 and thus allows each section to be heated to a different temperature. Such thermal isolation between the sections allows a temperature gradient to be generated across the processing bed 202 and facilitates chemical reaction within the fluid mixture 714.

Referring back to FIG. 6, at block 606, the method 600 includes dispensing a rinsing fluid onto the web; and removing by suction the rinsing fluid and a remaining portion of the fluid mixture remaining on the web after formation of the layer. During formation of the layer on the web, particles (e.g., CdS particles) may have nucleated within the fluid mixture. Not all particles become part of the layer. Some particles may constitute debris to be removed so as to prevent contamination of the formed layer. Also, in an example, not all the fluid mixture dispensed on the web is used for formation of the layer, and excess fluid mixture may remain as a residual material after formation of the layer.

Figure 10:
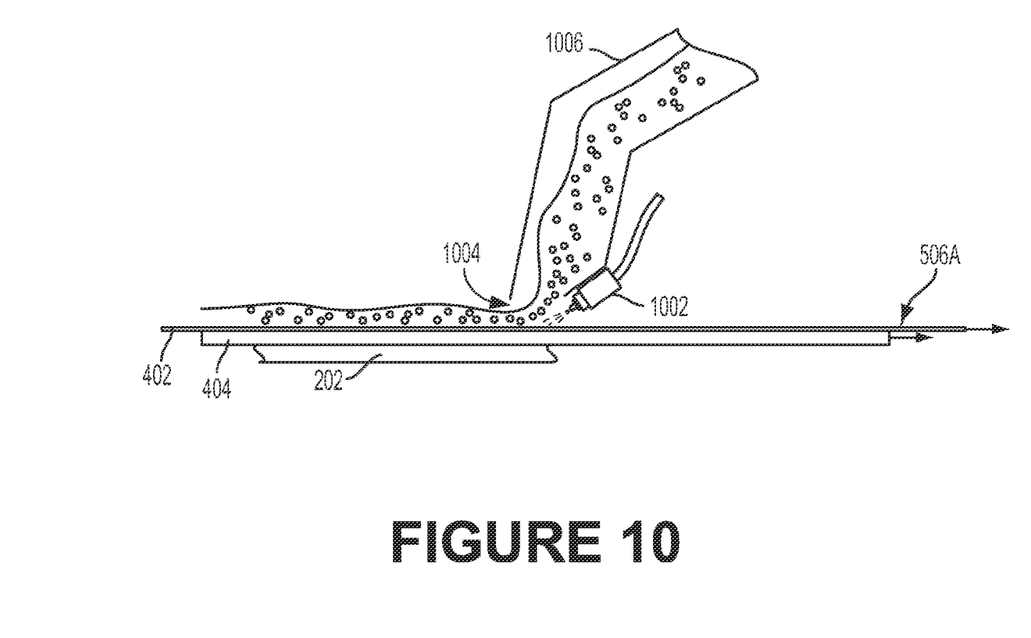
FIG. 10 illustrates a fluid removal apparatus for removal of residual material and debris, in accordance with an example embodiment.

FIG. 10 illustrates a fluid removal apparatus for removal of residual material and debris, in accordance with an example embodiment. The fluid removal apparatus includes a rinsing device and a suction device. FIG. 10 depicts a combination of a nozzle 1002 (as an example rinsing device) and a vacuum head 1004 (as an example suction device) configured for removal of residual material and debris from the surface of the web 402. Although one nozzle 1002 is depicted in FIG. 10, a plurality of nozzles can be used to dispense a rinsing fluid or rinsate. For example, the rinsate could include deionized water, surfactant or any number of fluids or mixtures.

The nozzle 1002 may be configured to dispense the rinsing fluid or rinsate on the web 402 as the web 402 moves (via the conveyor belt 404). As the nozzle 1002 dispense the rinsing fluid onto the surface of the web 402, the rinsing fluid forms a standing wave (or dam) that raises liquid level of the excess fluid locally as shown in FIG. 10. The rinsing fluid also loosens or knocks excess particles off of the first surface 506A of the web 402 and/or surface of the formed layer.

The vacuum head 1004 may be configured to apply suction at a predetermined height above the web 402. The rinsing fluid dispensed by the nozzle 1002 may locally raise the liquid level of the excess fluid to at least the predetermined height above the web 402. The suction applied by the vacuum head 1004 pulls the fluid up in a substantially perpendicular direction to the first surface 506A of the web 402. The material pulled up by the vacuum head 1004 enters a vacuum manifold 1006 and is transported through the vacuum manifold 1006 to, for example, a waste collection compartment. Thus, excess fluid and particles are removed and are not left to contaminate the surface of the web 402.

While the vacuum head 1004 applies suction onto the surface of the web 402 to pull the excess material up, the magnetic force exerted by interaction of the array of magnets embedded in the processing bed 202 and the magnetic material of the web 402 keeps the web 402 held down and constrained to the processing bed 202 such that the web 402 is not pulled up along with the excess material as the suction force of the vacuum head 1004 is applied.

The system 200 may include more modules or apparatuses for further processing. For instance, the system 200 may include a cleaning apparatus configured to clean the web 402 and the layer formed thereon via any type of suitable cleaning solution. In another example, the system 200 may include a drying apparatus configured to dry the (e.g., via an air knife or any other device) the web 402 and the layer formed thereon. In still another example, the system 200 may include an uncurling apparatus configured to uncurl edges of the web 402 after formation of the layer to make the web 402 substantially planar. In yet still another example, the system 200 may include a rolling apparatus that is configured to re-roll the web 402 after formation of the layer. In this example, the system 200 may be referred to as a roll-to-roll system as the web 402 may have been received as a roll 201 that is unwound for processing and deposition of the layer and re-rolled again after formation of the layer. The system 200 may include other modules or apparatuses for post-treatment and/or pre-treatment of the web 402.

Further, in some examples, the system 200 may include a variety of sensors that might be installed along the path that the web 402 travels through the system 200. As examples, the system 200 may include a thickness sensor configured to detect thickness of the coated web 402. The system 200 may also include an optical sensor configured to detect surface imperfections on the layer formed on the web 402. Other sensors may be configured to detect chemical composition either on surface and/or through depth of coating and the system 200 may be configured to control dispensing the first fluid 702 and the second fluid 704 (FIG. 7) accordingly. These sensors are examples for illustration only, and other types of sensors can be used in the system 200.

The methods and systems described in FIGS. 1-10 facilitate providing a moving web with a trough-like shape, providing for proper mixing and agitation of the fluids without contamination, and providing for removal of residual material and debris without re-contamination of the fluid mixture. In one example, the methods and systems described in FIGS. 1-10 may be implemented to form a buffer layer (e.g., CdS) in a solar cell from a fluid mixture deposited onto a moving web. However, the methods and systems described in FIGS. 1-10 can be used to form any type of liquid layer onto a moving web of any type for chemical reaction or film deposition or a combination of both.

While the present method and/or apparatus has been described with reference to certain implementations, it will be understood by those skilled in the art that various changes may be made and equivalents may be substituted without departing from the scope of the present method and/or apparatus. In addition, many modifications may be made to adapt a particular situation or material to the teachings of the present disclosure without departing from its scope. Therefore, it is intended that the present method and/or apparatus not be limited to the particular implementations disclosed, but that the present method and/or apparatus will include all implementations falling within the scope of the appended claims.

What is claimed is:

1. A system for forming a layer from a fluid mixture on a web, the system comprising:
   a fluid delivery apparatus for delivering the fluid mixture onto the web, the fluid delivery apparatus comprising a cascade device and a chemical dispenser device, wherein:
   the cascade device has an upper level, a lower level positioned above the web, a plurality of steps between the upper level and the lower level, and is configured to vibrate, and
   the chemical dispenser device is configured to dispense a stream of a first fluid of the fluid mixture and a stream of a second fluid of the fluid mixture onto the upper level of the cascade device, such that (i) the first and second fluids cascade down the steps to the lower level and onto the web and (ii) the first and second fluids are at least partially mixed by the cascade and by vibration of the cascade device prior to reaching the web;
   a fluid stirring apparatus comprising at least one fan positioned over the web and configured to generate a flow pattern that stirs the fluid mixture on the web while the layer is being formed, without the at least one fan contacting the fluid mixture; and
   a fluid removal apparatus comprising a rinsing device and a suction device, wherein:
   the rinsing device is configured to dispense a rinsing fluid onto the web, and
   the suction device is configured to remove by suction the rinsing fluid and a remaining portion of the fluid mixture remaining on the web after formation of the layer.

2. A The system of claim 1, further comprising one or more heaters, wherein the one or more heaters are configured to heat the fluid mixture on the web while the layer is being formed.

3. A The system of claim 2, wherein the fluid stirring apparatus comprises an array of fans, wherein the array of fans is configured to distribute vapor released from the fluid mixture on the web while the fluid mixture is being heated by the one or more heaters.

4. A The system of claim 3, wherein the one or more heaters, in combination with the array of fans, are configured to maintain a predetermined temperature profile in the fluid mixture on the web while the layer is being formed.

5. The system of claim 4, further comprising an enclosure that at least partially surrounds the array of fans, wherein the enclosure is configured to confine the vapor released from the fluid mixture.

6. The system of claim 3, further comprising an enclosure that at least partially surrounds the array of fans, wherein the enclosure is configured to confine the vapor released from the fluid mixture.

7. The system of claim 1, wherein the fluid stirring apparatus is configured to control speed and direction of rotation of the at least one fan over repeated cycles, each cycle comprising:
   the at least one fan rotating in a first direction for a first predetermined amount of time;
   the at least one fan stopping rotation for a second predetermined of time; and the at least one fan rotating in a second direction opposite to the first direction for a third predetermined amount of time.

8. The system of claim 1, wherein the suction device is configured to apply suction at a predetermined height above the web, and wherein the rinsing device is configured to dispense the rinsing fluid so as to raise a liquid level on the web to at least the predetermined height above the web.

9. The system of claim 1, further comprising:
a processing bed; and
a conveyor belt, wherein the conveyor is configured to move the web over the processing bed such that the web passes under the fluid delivery apparatus, the fluid stirring apparatus, and the fluid removal apparatus.

10. The system of claim 9, wherein the processing bed includes a center portion having a flat surface and side portions having curved surfaces, wherein the web has a trough shape that can hold fluid when the web passes under the fluid delivery apparatus, the fluid stirring apparatus, and the fluid removal apparatus, and wherein the trough shape is defined by the flat and curved surfaces of the processing bed.

11. The system of claim 10, further comprising a plurality of magnets, wherein the magnets are positioned relative to the processing bed so as to exert a magnetic force on the web that pulls the web toward the processing bed, and wherein the magnetic force is sufficient to shape the web so that the web substantially conforms to the flat surface and curved surfaces of the processing bed.

12. The system of claim 1, wherein the layer comprises cadmium sulfide, wherein the first fluid comprises cadmium sulfate, and wherein the second fluid comprises thiourea.

13. A method for forming a layer from a fluid mixture on a web, the method comprising:
dispensing a stream of a first fluid of the fluid mixture and a stream of a second fluid of the fluid mixture onto a cascade device, wherein the cascade device has an upper level, a lower level positioned above the web, a plurality of steps between the upper level and the lower level, and is configured to vibrate, and wherein the steam of first fluid and the stream of the second fluid are dispensed onto the upper level of the cascade device, such that (i) the first and second fluids cascade down the steps to the lower level and onto the web and (ii) the first and second fluids are at least partially mixed by the cascade and by vibration of the cascade device prior to reaching the web;
generating, using at least one fan positioned over the web, a flow pattern that stirs the fluid mixture on the web while the layer is being formed, without the at least one fan contacting the fluid mixture;
dispensing a rinsing fluid onto the web; and
removing by suction the rinsing fluid and a remaining portion of the fluid mixture remaining on the web after formation of the layer.

14. The method of claim 13, wherein one or more heaters are configured to heat the fluid mixture on the web while the layer is being formed, the method further comprising:
distributing, using the at least one fan, vapor released from the fluid mixture on the web while the fluid mixture is being heated by the one or more heaters; and
maintaining, using the one or more heaters in combination with the at least one fan, a predetermined temperature profile in the fluid mixture on the web while the layer is being formed.

15. The method of any of claim 13, further comprising:
controlling speed and direction of rotation of the at least one fan over repeated cycles, each cycle comprising:
the at least one fan rotating in a first direction for a first predetermined amount of time;
the at least one fan stopping rotation for a second predetermined of time; and
the at least one fan rotating in a second direction opposite to the first direction for a third predetermined amount of time.

16. The method of claim 13, wherein dispensing the rinsing fluid onto the web comprises dispensing the rinsing fluid so as to raise a liquid level on the web to at least a predetermined height above the web, and wherein removing by suction the rinsing fluid and the remaining portion of the fluid mixture remaining on the web after formation of the layer comprises applying suction at the predetermined height above the web.

17. The system of claim 5, wherein the fluid stirring apparatus is configured to control speed and direction of rotation of the at least one fan over repeated cycles, each cycle comprising:
the at least one fan rotating in a first direction for a first predetermined amount of time;
the at least one fan stopping rotation for a second predetermined of time; and
the at least one fan rotating in a second direction opposite to the first direction for a third predetermined amount of time.

18. The system of claim 17, wherein the suction device is configured to apply suction at a predetermined height above the web, and wherein the rinsing device is configured to dispense the rinsing fluid so as to raise a liquid level on the web to at least the predetermined height above the web.

19. The system of claim 18, further comprising:
a processing bed; and
a conveyor belt, wherein the conveyor is configured to move the web over the processing bed such that the web passes under the fluid delivery apparatus, the fluid stirring apparatus, and the fluid removal apparatus.

20. The method of claim 15, wherein dispensing the rinsing fluid onto the web comprises dispensing the rinsing fluid so as to raise a liquid level on the web to at least a predetermined height above the web, and wherein removing by suction the rinsing fluid and the remaining portion of the fluid mixture remaining on the web after formation of the layer comprises applying suction at the predetermined height above the web.

* * * * *